(12) United States Patent
Alm

(10) Patent No.: US 8,866,291 B2
(45) Date of Patent: Oct. 21, 2014

(54) FLIP-CHIP MOUNTED MICROSTRIP MONOLITHIC MICROWAVE INTEGRATED CIRCUITS (MMICS)

(75) Inventor: Roberto W. Alm, Windham, NH (US)

(73) Assignee: Raytheon Company, Waltham, MA (US)

( * ) Notice: Subject to any disclaimer, the term of this patent is extended or adjusted under 35 U.S.C. 154(b) by 296 days.

(21) Appl. No.: 13/370,915

(22) Filed: Feb. 10, 2012

(65) Prior Publication Data

US 2013/0208434 A1  Aug. 15, 2013

(51) Int. Cl.
H01L 23/34 (2006.01)
H01L 29/66 (2006.01)
H01L 23/48 (2006.01)
H01L 23/52 (2006.01)
H01L 29/40 (2006.01)

(52) U.S. Cl.
USPC ........... 257/728; 257/275; 257/774; 257/778; 257/E23.011

(58) Field of Classification Search
None
See application file for complete search history.

(56) References Cited

U.S. PATENT DOCUMENTS

| 5,202,752 A | 4/1993 | Honjo |
| 5,438,212 A * | 8/1995 | Okaniwa ................. 257/275 |
| 5,500,556 A * | 3/1996 | Kosugi ................... 257/718 |
| 5,977,631 A * | 11/1999 | Notani .................... 257/728 |
| 6,130,483 A * | 10/2000 | Shizuki et al. ........... 257/778 |
| 7,911,066 B2 * | 3/2011 | Ehlers et al. ............. 257/778 |
| 2003/0122153 A1 | 7/2003 | Suzuki et al. |
| 2011/0163919 A1 * | 7/2011 | Suzuki ............... 343/700 MS |

FOREIGN PATENT DOCUMENTS

| EP | 0 200 291 A2 | 11/1986 |
| EP | 0 200 291 A3 | 5/1987 |
| JP | 2010141366 | 6/2010 |

OTHER PUBLICATIONS

Notification of Transmittal of the International Search Report and the Written Opinion of the International Searching Authority, or the Declaration, PCT/US2013/020612, May 23, 2013, 4 pages.
Written Opinion of the International Searching Authority, PCT/US2013/020612, May 23, 2013, 6 pages.

\* cited by examiner

Primary Examiner — Hoang-Quan Ho
(74) Attorney, Agent, or Firm — Daly, Crowley, Mofford & Durkee, LLP

(57) ABSTRACT

A microstrip MMIC chip flip-chip mounted to a printed circuit board with conductive vias passing through the chip to electrical connect a ground plane of the microstrip MMIC chip to a ground conductor of the printed circuit board.

5 Claims, 3 Drawing Sheets

FLIP-CHIP MOUNTED MICROSTRIP MONOLITHIC MICROWAVE INTEGRATED CIRCUITS (MMICS)

TECHNICAL FIELD

This disclosure relates generally to flip-chip mounted microstrip monolithic microwave integrated circuits (MMICs).

BACKGROUND

As is known in the art, many applications require flip-chip mounted, Coplanar Waveguide (CPW), Monolithic Microwave Integrated Circuits (e.g., "module-less" systems, panel array technology or any other application where ribbon or wire bonds are excluded). However, CPW MMIC devices are typically more difficult to design than microstrip MMICs because they are typically less available, and usually exhibit degraded performance compared with its microstrip realized counterpart; particularly at higher frequencies of operation. For this reason, it is preferable to utilize more readily available, lower cost and higher performance microstrip MMIC devices in applications that require flip-chip technology.

As is also known in the art, in "module-less" applications, the electrical ground and thermal interfaces are typically opposite sides of the MMIC; whereas in a traditional microstrip environment, electrical ground and the thermal interface share the common back side of the MMIC. Separating the thermal interface from all electrical interfaces (including the electrical ground) enables the chip to be mounted directly on a printed circuit board (PCB), also sometimes also referred to as a printed wiring board (PWB), without the need for ribbon or wire bonds.

SUMMARY

In accordance with one feature of the disclosure, a microstrip MMIC chip flip-chip mounted to a printed circuit board with conductive vias passing through the chip to electrical connect a ground plane of the microstrip MMIC chip to a ground conductor of the printed circuit board is provided.

In one embodiment, a MMIC chip is provided having: a substrate; an active device and electrical strip conductors connect to the active device disposed in a front surface of the substrate; a ground plane conductor disposed on a back surface of the substrate, the strip conductor and the ground plane conductor providing a microstrip transmission line to the active device; and a ground region conductor and active device contact disposed on the front surface of the substrate, the active device contact being in electrical contact with the active device.

In one embodiment, a microwave structure is provided, comprising: (A) a MMIC, comprising: a substrate; an active device and electrical strip conductor connecting to the active device disposed in a front surface of the substrate; a ground plane conductor disposed on a back surface of the substrate, the strip conductor and the ground plane conductor providing a microstrip transmission line electrically interconnected to the active device; a ground region conductor and active device contact disposed on the front surface of the substrate, the active device contact being in electrical contact with the active device; a conductive via passing through the substrate electrically interconnecting the ground region conductor and the ground plane conductor; (B) a printed circuit board comprising: a dielectric layer having a ground conductor and active device contact pad thereon; and (C) wherein the active device contact pads on the dielectric layer is electrically connected to the active device contact on the front surface of the substrate and the ground conductor on the dielectric layer is electrically connected to the ground region conductor on the upper surface of the substrate.

In one embodiment, a microwave structure is provided, comprising: (A) a MMIC, comprising: a substrate; an active device and electrical strip conductor connecting the active device disposed in a front surface of the substrate; a ground plane conductor disposed on a back surface of the substrate, the strip conductor and the ground plane conductor providing a microstrip transmission line electrically interconnected to the active device; a ground region conductor and active device contact disposed on the front surface of the substrate, the active device contact being in electrical contact with the active device; a conductive vias passing through the substrate electrically interconnecting the ground region conductor and the ground plane conductor; (B) a multilayer printed circuit board comprising: a plurality of stacked dielectric layers, an upper one of the dielectric layers having an electrically conductive ground pad and an electrically active device contact pad thereon; a conductive via passing from the ground pad on the upper one of the dielectric layers, through the upper one of the dielectric layers to a ground plane electrical conductor on the surface of another one of the dielectric layers; and (C) wherein the active device contact on the upper one of the dielectric layers is electrically connected to the active device contact on the front surface of the substrate and the ground pad on the upper one of the dielectric layers is electrically connected to the ground region conductor on the upper surface of the substrate.

The details of one or more embodiments of the disclosure are set forth in the accompanying drawings and the description below. Other features, objects, and advantages of the disclosure will be apparent from the description and drawings, and from the claims.

DESCRIPTION OF DRAWINGS

Like reference symbols in the various drawings indicate like elements.

DETAILED DESCRIPTION

Figure 1:
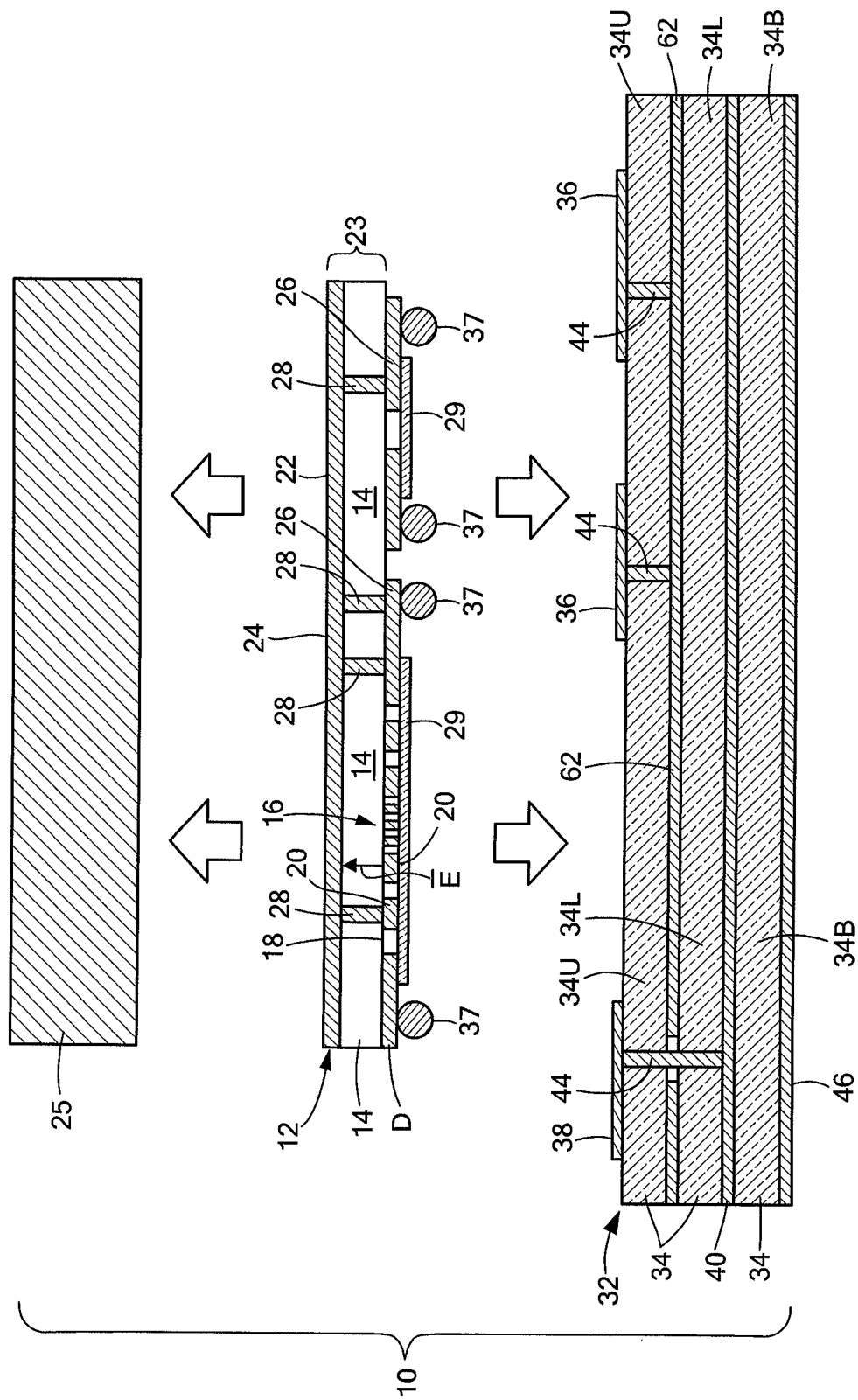
FIG. 1 is a simplified exploded view of a portion of a microwave structure according to the disclosure.
Figure 2:
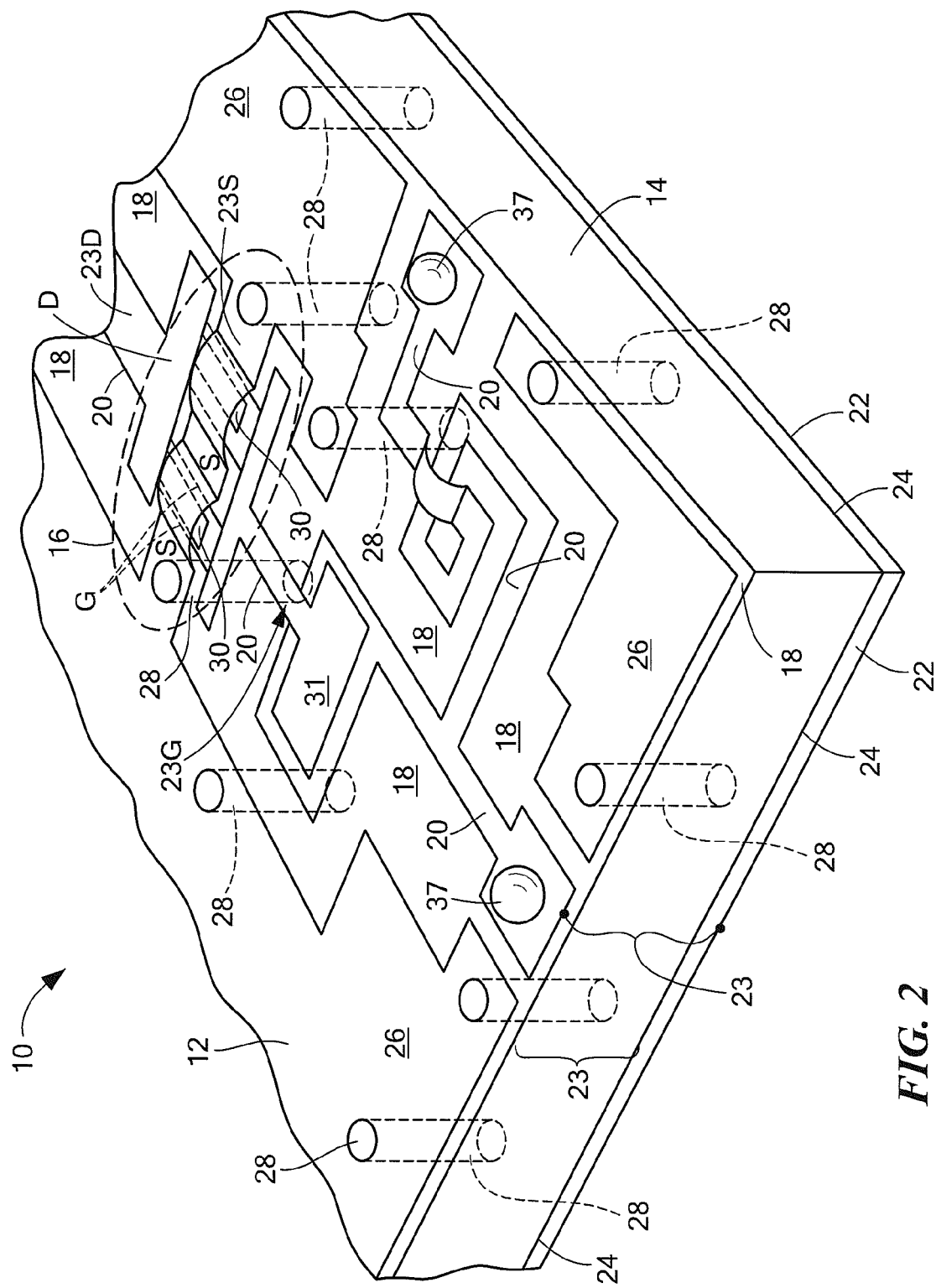
FIG. 2 is a simplified, partially broken away, isometric sketch of a portion of a MMIC according to the disclosure, such MMIC being one of the elements in the microwave structure of FIG. 1.
Figure 3:
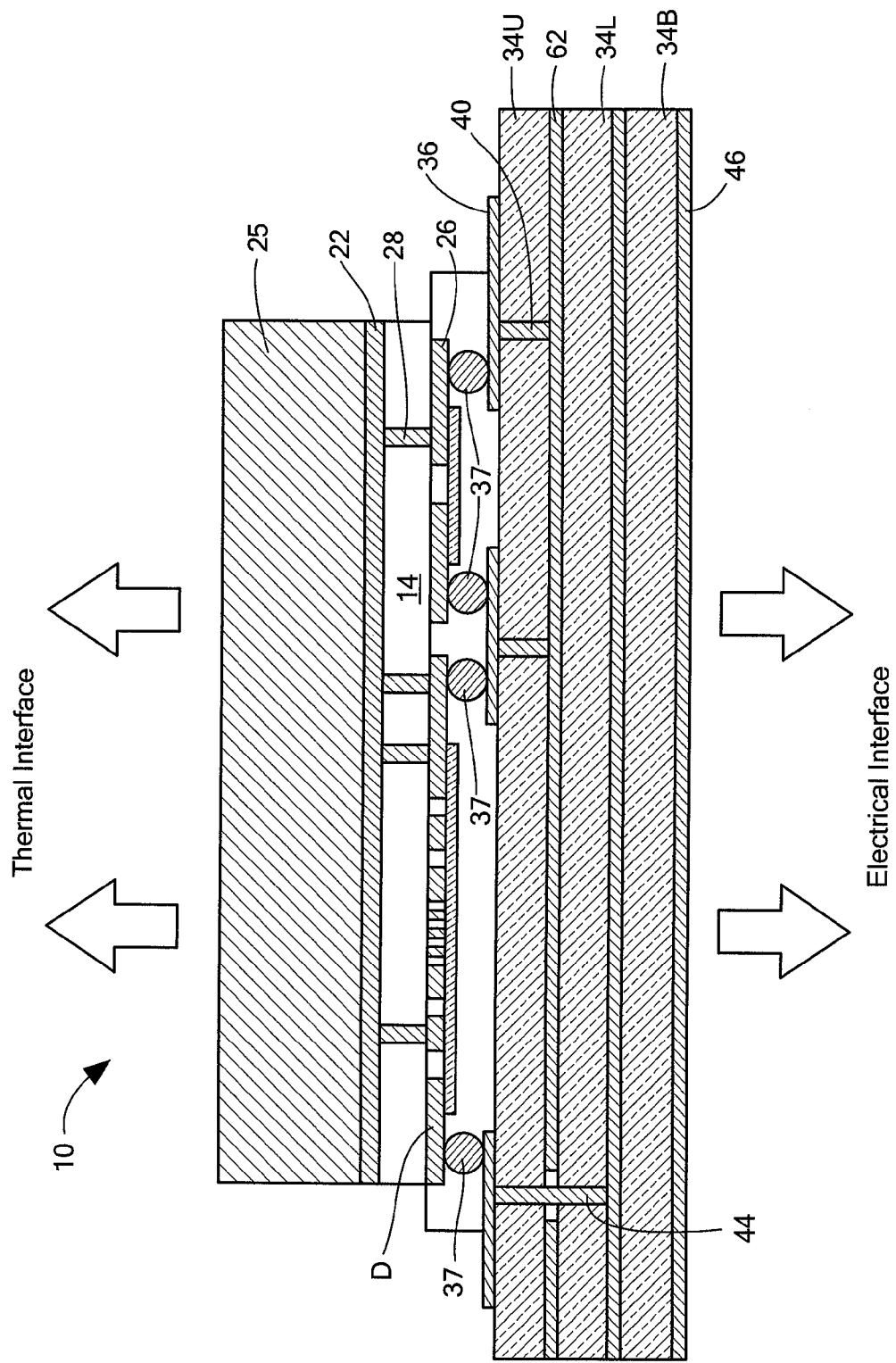
FIG. 3 is a simplified assembled view of a portion of a microwave structure according to the disclosure.

Referring now to FIGS. 1, 2 and 3, a microwave structure 10 is shown having a Monolithic Microwave Integrated Circuit (MMIC) 12. The MMIC 12 includes a substrate 14 having typically a plurality of active semiconductor devices, (here only one active device 16 being shown in FIG. 2), here, for example a FET being shown on the upper surface 18 in FIG. 2 of the portion of the MMIC 12 shown in FIG. 1. The MMIC 12 includes electrical strip conductors 20, connecting the active device 16, also disposed on the front surface 18 of the substrate 14. The MMIC 12 also includes a ground plane conductor 22 disposed on a back surface 24 of the substrate 14, the strip conductors 20 and the ground plane conductor 22 providing microstrip transmission lines 23 electrically interconnected to the active device 16.

The MMIC 12 also includes a plurality of ground region conductors 26 and active device contacts S, D and G disposed on the front surface 18 of the substrate 14. The active device contacts S, D and G are in electrical contact with the active device 16. The upper surface of the MMIC 12 includes a dielectric layer 29 (FIG. 1). The dielectric layer 29 (FIG. 1) is here for example disposed over the upper surface of the MMIC 12; however the dielectric layer 29 may have air gaps therein over the active devices 16. It is noted that, a heat sink conductor 25 or interposer/planarizer is here, in this embodiment, bonded to the ground plane conductor 22, as shown in FIG. 1.

It is noted that the strip conductors 20 and ground plane conductor 22 with the substrate 14 support an electric field (indicated by the arrow or vector E in FIG. 1) passing between the strip conductors 20 and ground plane conductor 22 to provide a microstrip transmission line 23 and that the ground region conductors 26 are sufficiently spaced from the strip conductors 20 so that the ground region conductors 26 do not form a coplanar waveguide (CPW). The MMIC 12 includes a DC blocking capacitor 31 (FIG. 2).

Here, as noted above, the active device 16 is a FET having: a plurality of finger-like gate electrodes G connected to a strip transmission line 23G one of the microstrip transmission lines 23, a plurality of source electrodes S electrically interconnected together by an air-bridge conductor 30, and to a pair of the ground region conductors 26, and drain electrodes D disposed under the air bridge conductor 30 connected to microstrip transmission lines 23D of the microstrip transmission lines 23.

The MMIC 12 has a plurality of conductive vias 28 passing through the substrate 14 electrically interconnecting the ground region conductors 26 and the ground plane conductor 22.

The microwave structure 10 includes a multilayer printed circuit board 32 (FIGS. 1 and 3) comprising a plurality of stacked dielectric layers 34, an upper one of the dielectric layers 34U having an electrically conductive ground pads 36 and an electrically active device contact pads D, G and S thereon; a conductive vias 44 passing from the ground pad 38 on the upper one of the dielectric layers 34U, through the upper one of the dielectric layers 34U to a ground plane electrical conductor 62 on the surface of another, lower one of the dielectric layers 34L.

It is noted that the MMIC 12 is flip-chip mounted to the multilayer printed circuit board 32 using industry standard (Surface Mount Technology) and techniques, such as solder balls 37. More particularly, the active device contacts 38 on the upper one of the dielectric layers 34U are electrically connected to the active device contacts, D, G and S, here for example active device contact pad D 38 being shown in FIG. 3, on the front surface 18 of the substrate 14 and the conductive ground pads 36 on the upper one of the dielectric layers 34U is electrically connected to the ground region conductors 26 on the upper surface of the MMIC 12 through the conductive solder balls 37. It is also noted that the strip conductor 20 of the microstrip transmission lines 23D, which is connected to active device contact pad D, is connected to the strip conductor 40 on the upper surface of a third one of the dielectric layers, here layer 34L using a conductive via 44 passing from active device contact pad D to strip conductor 40 through solder ball D; it being noted that the via 44 is electrically insulated from the ground plane electrical conductor 62 on the surface dielectric layers 34U. Here, a ground plane conductor 46 is disposed on the bottom surface of one of the dielectric layers 34B, as shown.

A number of embodiments of the disclosure have been described. Nevertheless, it will be understood that various modifications may be made without departing from the spirit and scope of the disclosure. For example, the semiconductor devices may be Si, GaAs, GaN, etc. devices. Further, a fill material as shown in FIG. 3 may be used in the flip-chip mounting. Accordingly, other embodiments are within the scope of the following claims.

What is claimed is:

1. A Monolithic Microwave Integrated Circuit (MMIC) chip, comprising:
    a semiconductor substrate;
    an active semiconductor device disposed in the substrate and having an electrical contact disposed on a front surface of the substrate;
    an electrical strip conductor disposed on the front surface of the substrate and electrically connected to the electrical contact of the active device;
    a ground plane conductor disposed on a back surface of the substrate, the strip conductor and the ground plane conductor providing a microstrip transmission line electrically connected to the electrical contact of the active device;
    a ground region conductor disposed on the front surface of the substrate and physically spaced from the microstrip transmission and the electrical contact sufficient to prevent the strip conductor and the ground region conductor from providing a coplanar waveguide (CPW) transmission line comprising the ground region conductor and the strip conductor; and
    a conductive via passing through the substrate electrically connecting the ground region conductor and the ground plane conductor.

2. A microwave structure, comprising:
    (A) a Monolithic Microwave Integrated Circuit (MMIC) chip, comprising:
        a semiconductor substrate;
        an active semiconductor device disposed in the substrate and an electrical contact disposed on a front surface of the substrate;
        an electrical strip conductor disposed on the front surface of the substrate and electrically connected to the electrical contact of the active device;
        a ground plane conductor disposed on a back surface of the substrate, the strip conductor and the ground plane conductor providing a microstrip transmission line electrically interconnected to the electrical contact of the active device;
        a ground region conductor disposed on the front surface of the substrate;
        a conductive via passing through the substrate electrically interconnecting the ground region conductor and the ground plane conductor;
    (B) a printed circuit board comprising:
        a dielectric layer having a ground conductor and active device contact pad thereon; and
    (C) wherein the active device contact pad on the dielectric layer is electrically connected to the active device contact on the front surface of the substrate and the ground conductor on the dielectric layer is electrically connected to the ground region conductor on the front surface of the substrate.

3. The microwave structure recited in claim 2 wherein the substrate with the active device therein is flip-chip mounted to the printed circuit board.

4. A microwave structure, comprising:
(A) a Monolithic Microwave Integrated Circuit (MMIC) chip, comprising:
   a semiconductor substrate;
   an active semiconductor device disposed in the substrate having an electrical contact disposed on a front surface of the substrate;
an electrical strip conductor disposed on the front surface of the substrate and electrically connected to of the active device;
   a ground plane conductor disposed on a back surface of the substrate, the strip conductor and the ground plane conductor providing a microstrip transmission line electrically interconnected to the electrical contact of the active device;
   a ground region conductor disposed on the front surface of the substrate;
   a conductive via passing through the substrate electrically interconnecting the ground region conductor and the ground plane conductor;
(B) a multilayer printed circuit board comprising:
   a plurality of stacked dielectric layers, an upper one of the dielectric layers having an electrically conductive ground pad and an electrically active device contact pad thereon;
   a conductive via passing from the ground pad on the upper one of the dielectric layers, through the upper one of the dielectric layers to a ground plane electrical conductor on the surface of another one of the dielectric layers; and
(C) wherein the active device contact on the upper one of the dielectric layers is electrically connected to said one of the source, drain and gate electrodes of the active device on the front surface of the substrate and the ground pad on the upper one of the dielectric layers is electrically connected to the ground region conductor on the upper surface of the substrate.

5. The microwave structure recited in claim 2 wherein the ground region conductor is physically spaced from the microstrip transmission and said one of the source, drain and gate electrodes along a direction parallel to the front surface sufficient to prevent the strip conductors and the ground region conductor from providing a coplanar waveguide (CPW) comprising the ground plane region conductor and the strip conductor.

* * * * *